US011927839B2

United States Patent
Kaikkonen et al.

(10) Patent No.: US 11,927,839 B2
(45) Date of Patent: Mar. 12, 2024

(54) BROADBAND ELECTRO-ABSORPTION OPTICAL MODULATOR USING ON-CHIP RF INPUT SIGNAL TERMINATION

(71) Applicant: II-VI Delaware, Inc., Wilmington, DE (US)

(72) Inventors: Andrei Kaikkonen, Jarfalla (SE); David Adams, Stockholm (SE); Robert Lewen, Tyreso (SE); Nicolae Chitica, Kista (SE)

(73) Assignee: II-VI Delaware, Inc., Wilmington, DE (US)

( * ) Notice: Subject to any disclaimer, the term of this patent is extended or adjusted under 35 U.S.C. 154(b) by 799 days.

(21) Appl. No.: 17/019,706

(22) Filed: Sep. 14, 2020

(65) Prior Publication Data
US 2022/0082874 A1   Mar. 17, 2022

(51) Int. Cl.
*H01S 5/06* (2006.01)
*G02F 1/025* (2006.01)
*G02F 1/015* (2006.01)

(52) U.S. Cl.
CPC ............ *G02F 1/025* (2013.01); *H01S 5/0601* (2013.01); *G02F 1/0157* (2021.01); *G02F 2202/101* (2013.01); *G02F 2202/102* (2013.01); *G02F 2202/108* (2013.01)

(58) Field of Classification Search
CPC .. G02F 1/025; G02F 1/0157; G02F 2202/101; G02F 2202/102; G02F 2202/108; H01S 5/0601; H01S 5/02345; H01S 5/0427; H01S 5/06226; H01S 5/12; H01S 5/22; H01S 5/34306; H01S 2301/176; H01S 5/0239; H01S 5/0265; H01S 5/04257
See application file for complete search history.

(56) References Cited

U.S. PATENT DOCUMENTS

| | | | |
|---|---|---|---|
| 6,343,163 B1 * | 1/2002 | Kawanishi | H01S 5/026 385/40 |
| 7,266,256 B1 | 9/2007 | Schulz | |
| 7,345,803 B2 | 3/2008 | Nakajima et al. | |
| 7,373,090 B2 | 5/2008 | Kazemi-Nia et al. | |
| 7,400,791 B2 | 7/2008 | Kagaya | |
| 7,426,321 B2 | 9/2008 | Eriksson et al. | |
| 7,899,277 B2 | 3/2011 | Koh | |

(Continued)

OTHER PUBLICATIONS

Oh Kee Kwon, "Improvement of modulation bandwidth in electroabsorption-modulated laser by utilizing the resonance property in bonding wire", May 21, 2012/vol. 20, No. 11/Optics Express, pp. 11806-11812.

*Primary Examiner* — Xinning(Tom) Niu
(74) *Attorney, Agent, or Firm* — Wendy W. Koba

(57) ABSTRACT

An electro-absorption modulator (EAM) is configured to include an on-chip AC ground plane that is used to terminate the high frequency RF input signal within the chip itself. This on-chip ground termination of the modulation input signal improves the frequency response of the EAM, which is an important feature when the EAM needs to support data rates in excess of 50 Gbd. By virtue of using an on-chip ground for the very high frequency signal content, it is possible to use less expensive off-chip components to address the lower frequency range of the data signal (i.e., for frequencies less than about 1 GHz).

10 Claims, 6 Drawing Sheets

(56) References Cited

U.S. PATENT DOCUMENTS

| | | | |
|---|---|---|---|
| 8,363,990 B1 * | 1/2013 | Skogen | G02F 1/015 385/2 |
| 9,007,672 B2 | 4/2015 | Han et al. | |
| 9,436,019 B1 | 9/2016 | Pelekhaty et al. | |
| 10,547,158 B1 | 1/2020 | McColloch et al. | |
| 10,673,532 B2 | 6/2020 | Hjartarson et al. | |
| 2005/0276615 A1 * | 12/2005 | Ranganath | H04B 10/505 398/183 |
| 2006/0008194 A1 | 1/2006 | Kagaya et al. | |
| 2007/0217465 A1 * | 9/2007 | Hashimoto | H01S 5/11 372/50.11 |
| 2009/0065901 A1 * | 3/2009 | Sakuma | H01S 5/22 257/618 |
| 2010/0232468 A1 * | 9/2010 | Shiota | H01S 5/3434 372/50.1 |
| 2010/0328753 A1 * | 12/2010 | Hayashi | G02F 1/2257 359/333 |
| 2013/0272326 A1 | 10/2013 | Yamatoya et al. | |
| 2018/0067341 A1 | 3/2018 | Kanazawa et al. | |
| 2018/0149818 A1 * | 5/2018 | Yamauchi | H01S 5/02251 |

* cited by examiner

100

BROADBAND ELECTRO-ABSORPTION OPTICAL MODULATOR USING ON-CHIP RF INPUT SIGNAL TERMINATION

TECHNICAL FIELD

The present invention relates to electro-absorption optical modulators (EAMs) and, more particularly, to EAMs configured to provide on-chip termination of the applied RF drive signal (electrical data input to EAM).

BACKGROUND OF THE INVENTION

Electro-absorption modulators are used in conjunction with laser sources to form an optical transmission arrangement that is relatively compact and based upon the use of relatively low drive voltage levels. In operation, a continuous wave (CW) optical beam from a laser source propagates through a waveguiding region of the EAM, where electrical contacts are positioned above and below the waveguiding region. The application of an electrical data signal to these contacts introduces a change in the optical properties of the waveguide as a function of the change in voltage across the waveguide (as a result of the Franz-Keldysh effect for bulk waveguide structures or the quantum-confined Stark effect for MQW waveguide structures). The presence of the electrical signal in combination with the CW optical beam results in creating a modulated optical output signal, achieved via electrical to optical conversion, that represents the data stream applied as an electrical input waveform to the modulator.

As optical communication systems continue to be required to transmit data at higher and higher data rates (e.g., in excess of 50 Gbd and above), the high-frequency response of the EAM is a particular area of concern, since limitations in response result in the introduction of errors to the modulated output signal (that is, diminish the signal integrity of the system). Along with the communications industry's imperative with respect to maintaining (or improving) signal integrity for ever-increasing data rates, there is a parallel interest in minimizing the cost and footprint of the circuitry within optical transmitters. For electro-absorption modulated lasers (EMLs), "signal integrity" typically refers to the fidelity of the output modulated optical waveform when compared to the ideal intended waveform.

SUMMARY OF THE INVENTION

Various advancements over the state of the part are provided by the present invention, which is directed to a broadband EAM that is configured to address these concerns by terminating the high frequency drive signal line within the chip upon which the EAM structure is fabricated. In particular, an AC ground plane is disposed within the EAM structure and separated from the conventional DC ground of the chip substrate by a relatively thin dielectric layer. The combination of the AC ground plane, dielectric layer, and DC ground thus forms a distributed capacitance within the EAM structure that is free of the various parasitics associated with prior art EAM devices. Additional circuit elements, both on-chip and off-chip as described in detail herein, function together to collectively maximize the modulation bandwidth and signal integrity over an extended bandwidth from low modulation frequencies (e.g., 1 GHz or less) up to, and in excess of, 50 GBd/s, while enabling the use of a more economical and compact transmitter footprint than possible for prior art devices.

It is an aspect of the present invention that the utilization of an on-chip termination for the RF signal allows for the use of less costly components (e.g., decoupling capacitor) to address the low frequency end (<1 GHz) of the incoming RF signal. Moreover, the AC ground plane may be used as the bias supply rail for the EAM, eliminating the need for a bulky, complex bias-T network to be used at the input to the EAM (used in the prior art to supply both the bias voltage and RF input to the EAM).

An EAM formed in accordance with the principles of the present invention may be easily integrated in the same semiconductor structure as the laser diode light source to form a monolithic electro-absorption modulated laser (EML).

An exemplary embodiment of the present invention may take the form of an electro-absorption optical modulator formed on a semiconductor substrate (e.g., n-type InP) and includes an active layer with an optical waveguiding layer (e.g., p-type InP) disposed over the active layer. The optical waveguiding layer is configured to receive an incoming continuous wave (CW) optical signal and generate an optically modulated output signal therefrom based on an input electrical RF modulating signal. The modulator also includes a dielectric layer disposed on a portion of the top surface of the substrate separate from the electro-absorption modulating device and a conductive layer disposed over the dielectric layer. The combination of the substrate, the dielectric layer and the conductive layer forms a distributed capacitance within the electro-absorption optical modulator chip. A stripline conductor is disposed over an extended portion of the optical waveguiding layer and an RF signal input path is coupled to the stripline conductor for providing an electrical input modulating signal to the electro-absorption modulating device. A resistive RF signal termination path is coupled between the stripline conductor and the conductive layer, wherein accordance with the principles of the present invention the conductive layer is utilized as an on-chip AC ground termination for the RF signal of the electro-absorption optical modulator.

Other and further aspects and embodiments of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
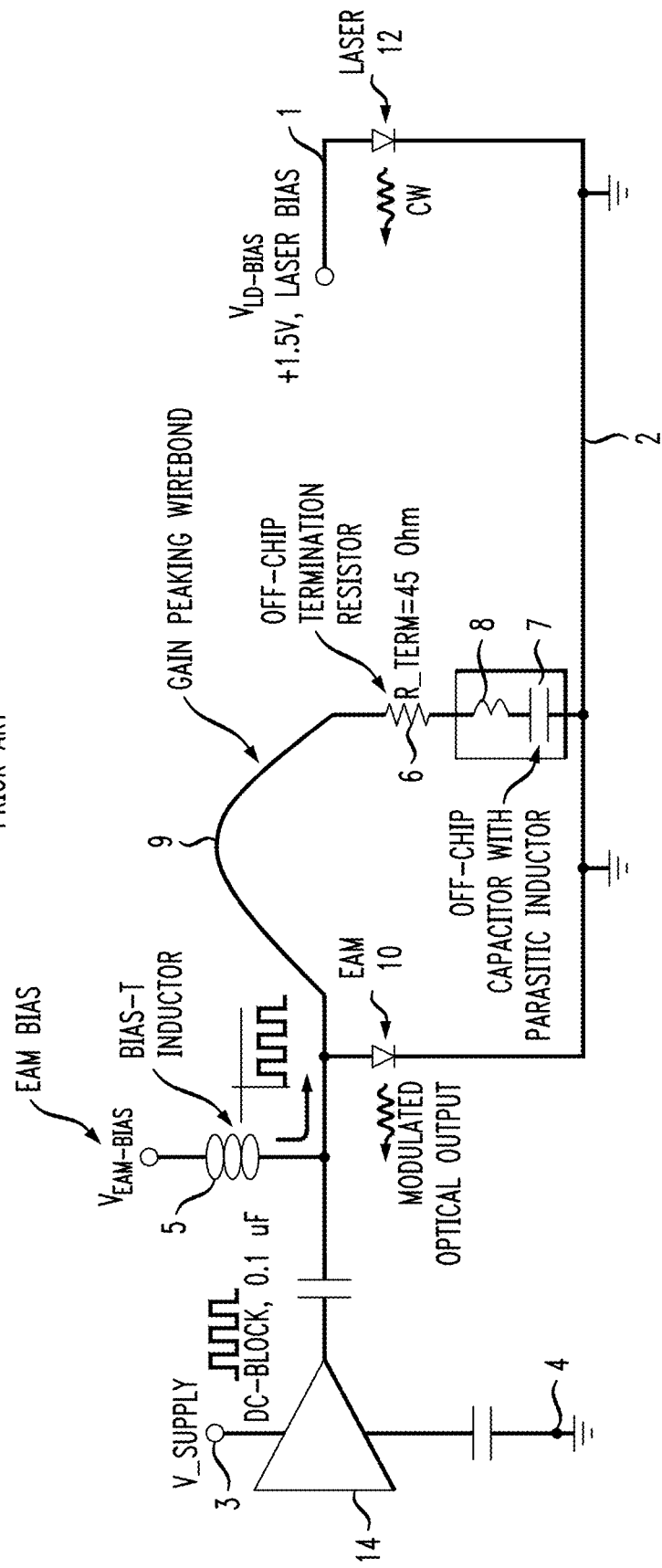
FIG. 1 is a simplified schematic of a typical prior art EML

As mentioned above, optical communication systems continue to be required to transmit data at higher and higher data rates (e.g., in excess of 50 GBd and above) and, as a result, the high-frequency response of an EAM is a particular area of concern, since limitations in its frequency response may result in the introduction of errors in the output modulated optical signal and thus diminish the signal integrity of the system. For EAMs, "signal integrity" typically refers to the fidelity of the output modulated optical waveform when compared to the ideal intended waveform. To optimize the fidelity of the electrical-to-optical conversion between the applied electrical RF drive (data) signal and the output modulated optical signal, there are several performance characteristics that are typically analyzed to assess the operation of the EAM. An exemplary set of performance characteristics may include, for example: (1) the "flatness" of the modulation response over a very large range of modulation frequencies; (2) a low level of electrical RF reflections fed back into the driver circuit; (3) some "peaking" of the electrical-to-optical modulation conversion amplitude at the Nyquist frequency of the baud rate; (4) minimal timing jitter (i.e., unintended timing offsets of the waveform rising edge and falling edge); and (5) minimal group delay variation (i.e., minimal latency variation over the relevant range of RF frequencies for a particular baud rate).

As will be described in detail hereinbelow, an electro-absorption modulator (EAM) formed in accordance with the principles of the present invention is configured to address these concerns by terminating the high frequency drive signal line within the chip upon which the EAM structure is fabricated. This on-chip AC ground termination of the modulation input signal has been found to improve the frequency response of the EAM, which as mentioned above is an important feature when the EAM needs to support data rates in excess of 50 Gbd. By virtue of using an on-chip AC ground for the high frequency signal content in accordance with the principles of the present invention, it is possible to use less expensive off-chip components to address the lower frequency range of the data signal (i.e., for frequencies less than about 1 GHz). As a result, the EAM of the present invention provides very good data signal transmission integrity during the electrical-to-optical conversion.

While described below as a component of an EML, fabricated in the same semiconductor chip as the laser diode light source, it is to be understood that an EAM formed in accordance with the principles of the present invention may also be used as a separate component, receiving an optical input that is coupled into the modulator waveguide from the output of a discrete laser diode light source.

Additionally, the inclusion of an AC ground plane within the structure of the EAM component provides the possibility of using the ground plane as an access point for applying the reverse bias DC voltage required to operate the EAM. The ability to bring in the DC bias voltage along this line allows an EAM of the present invention to eliminate the need to use bulky bias-T components to provide the combination of the input RF drive signal and DC voltage at the input to the EAM. Moreover, at least one embodiment of the present invention allows for the use of a conventional n-type substrate for the EAM chip to further control costs by using conventional integrated circuit fabrication techniques.

For the sake of comparison, FIG. 1 is a schematic representation of a conventional prior art arrangement for providing electrical inputs to an EAM 10 and an associated CW laser diode 12. Laser diode 12 is shown as disposed between a positive DC voltage rail 1 and a DC ground plane 2, where DC voltage rail 1 provides the bias voltage (denoted $V_{LD\_bias}$) required to energize laser diode 12 and generate the CW optical output.

The RF drive (data) input signal is supplied to EAM 10 by an RF driver circuit 14. In this prior art arrangement, RF driver circuit 14 is coupled between a positive voltage supply 3 and an external DC ground plane 4. A bias-T circuit 5 is included in this prior art arrangement of FIG. 1 and used to direct both the incoming RF data signal from RF driver circuit 14 and a DC reverse bias voltage ($V_{eam\_bias}$) along an RF signal input path to an "anode" region of EAM 10. An RF signal termination path from EAM 10 is shown as passing through a terminating resistor 6 coupled to an off-chip capacitor 7 via a wirebond 8. The "cathode" region of EAM 10 is shown as coupled to DC ground plane 2 (and thus held at the same ground level as laser diode 12). A wirebond 9 connects the anode of EAM 10 to termination resistor 6, where the length of wirebond 9 may be selected to provide some gain peaking of the RF modulation signal at approximately the Nyquist frequency of the data rate.

The operating characteristics of the prior art arrangement of FIG. 1 can be evaluated by applying microwave transmission line principles (including a study of the S-parameters). Here, for example, the high frequency operation of EAM 10 is impacted by the high frequency qualities of off-chip capacitor 7, particularly with respect to its preferred position as adjacent to the EML chip (preferred to enable the disposition of a targeted length of the attaching wirebond 8, so as to produce an intended inductance from that wirebond). Typically, off-chip capacitor 7 needs to have a value on the order of about 100 nF, which has been found to degrade performances at critical frequencies, such as 10 GHz and above. This close-proximity placement of a large-valued off-chip capacitor 7, as well as its wirebond attachment, together generate cross-talk to other parts of the EML circuitry and/or neighboring electronic circuitry, principally because the wirebond supports conduction of very high frequency signal content, which is known to radiate efficiently from a wirebond.

In contrast, and now described in detail below, the configuration of the present invention substantially minimizes the possibility of the creation of parasitics and the resulting capability of cross-talk, since the majority of the very high frequency content of the RF signal is removed at the on-chip AC ground node, and therefore does not pass through a wirebond to any off-chip capacitive components.

Figure 2:
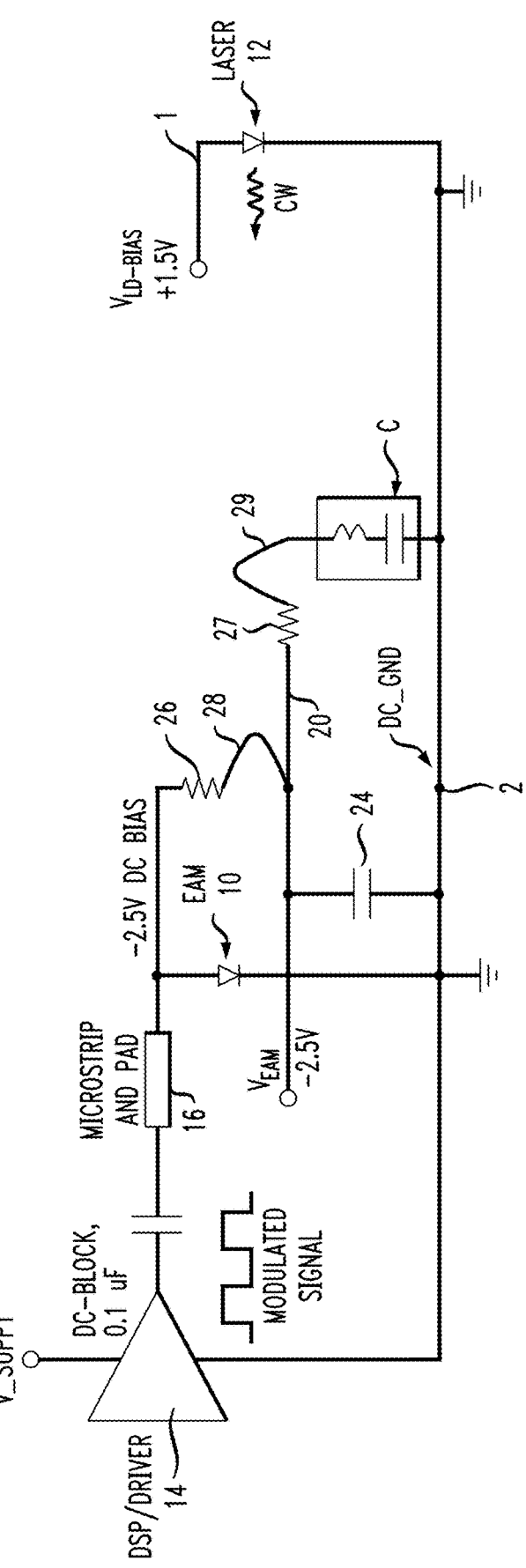
FIG. 2 is a simplified schematic of an EML including an EAM formed in accordance with the principles of the present invention to provide on-chip termination of the very high frequency RF drive signal.
Figure 3:
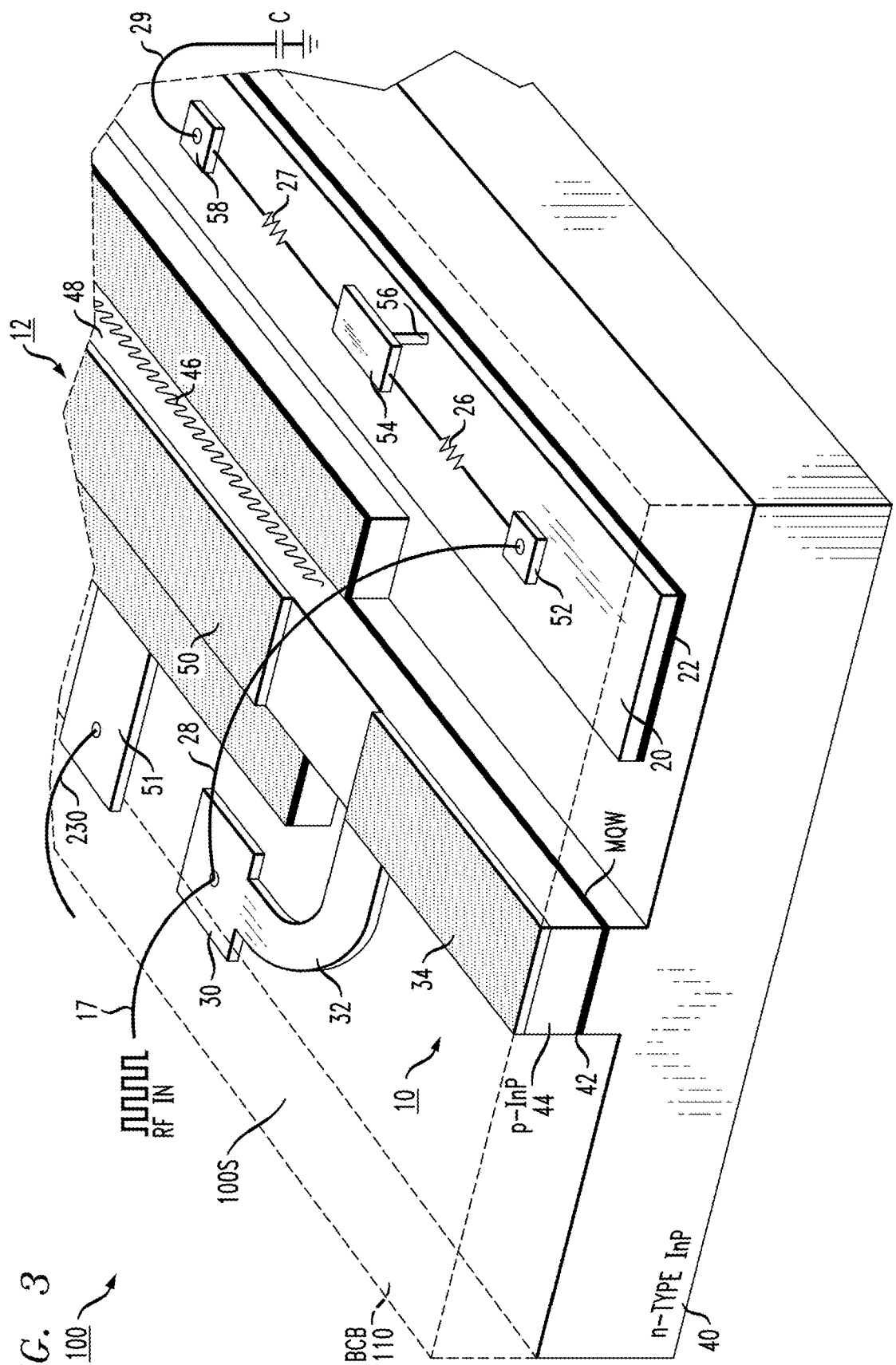
FIG. 3 is an isometric view of an exemplary embodiment of the EAM as shown in FIG. 2.

FIG. 2 is a schematic diagram of an EAM using an RF signal input path and an RF signal termination path formed in accordance with the present invention to improve the frequency response of an EAM, while at least maintaining (if not improving) the integrity of the transmitted data signal. FIG. 3 is a simplified isometric view of an EML chip 100 formed to include the signaling and termination paths shown in FIG. 2. It is contemplated that certain aspects of the present invention are best understood by reviewing FIGS. 2 and 3 together, where FIG. 2 best shows the electrical performance aspects of the present invention and FIG. 3 best illustrates an exemplary physical arrangement of components that provide the improved electrical performance.

With reference to both FIGS. 2 and 3, EAM 10 and laser diode 12 are understood to embody similar structures as those of the prior art, and in this particular embodiment are both integrated within a single semiconductor EML chip 100. Also similar to the above prior art, laser diode 12 is coupled between positive DC voltage rail 1 and DC ground plane 2 and thus generates the CW optical beam that next passes through the waveguiding region of EAM 10.

Figure 7:
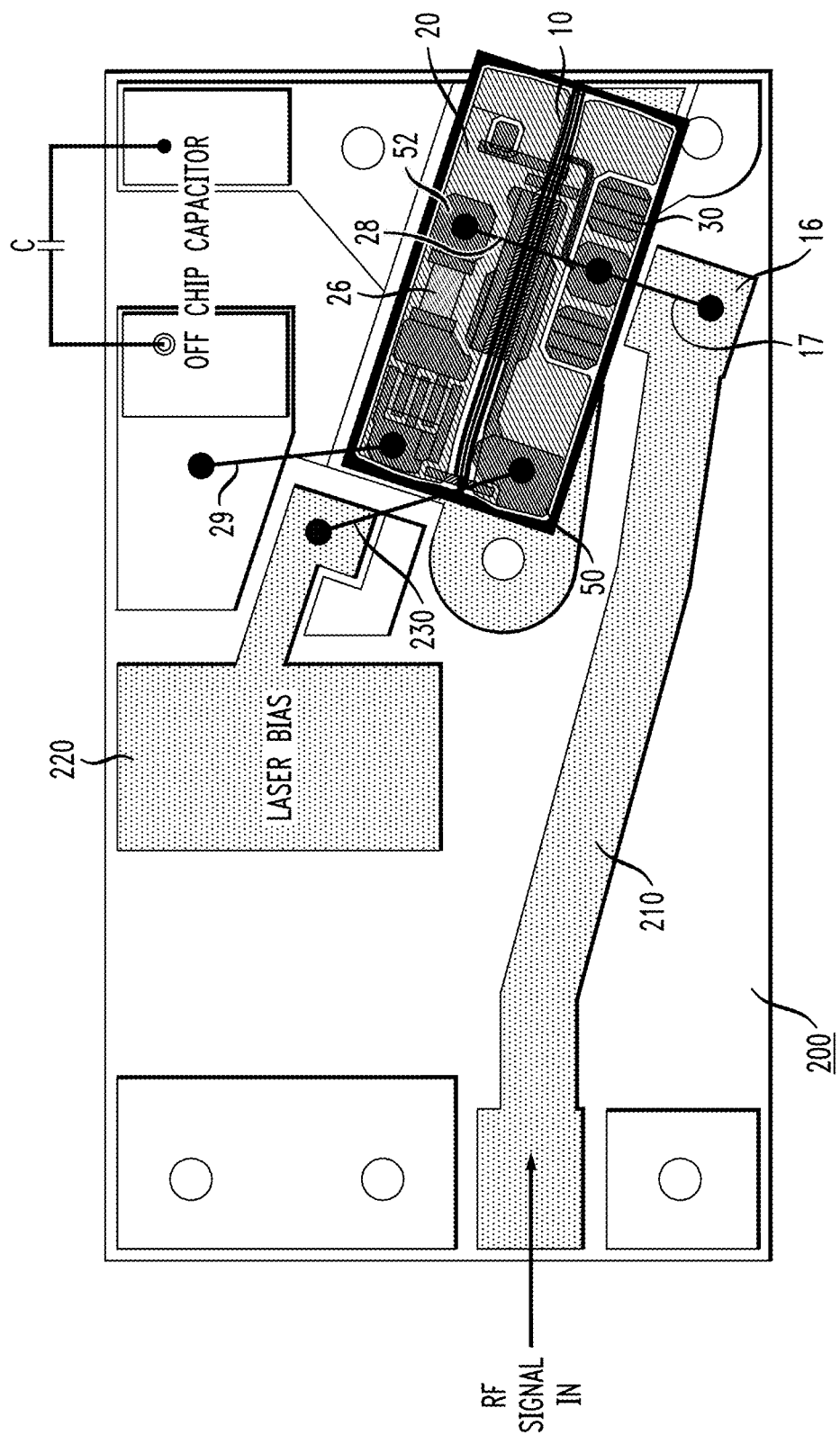
FIG. 7 is a top view of a "chip-on-carrier" (CoC) arrangement including the EML chip of FIG. 6.

The RF input data signal is shown as delivered to EAM 10 via a microstrip metal line 16 that is disposed on a silicon, ceramic or dielectric chip carrier upon which the EML chip is mounted (such as shown in FIG. 7, discussed in detail below). EAM 10 terminates on DC ground plane 2, in a manner similar to the prior art.

In accordance with the principles of the present invention, an AC ground plane 20 is included within EAM chip 10 and used as the ground termination for the RF signal path. As shown, AC ground plane 20 is separated from DC ground plane 2 (represented by n-type substrate 40 in FIG. 3) by a relatively thin dielectric layer 22. The combination of AC ground plane 20, dielectric layer 22 and DC ground plane 2 forms a distributed capacitance 24 (which may have a value on the order of 130 pF) that is virtually free of parasitics that are typically associated with off-chip lumped circuit elements used in the prior art to improve the frequency response of an EAM. Thus, the inclusion of an on-chip distributed capacitance in accordance with the principles of the present invention contributes to the achievement of high overall modulation signal integrity, while also reducing the cost, size, and complexity of the EML sub-assembly arrangement (i.e., the semiconductor chip within which the EML is fabricated, the RF carrier, and circuit elements added to or integrated on the carrier).

Continuing with reference to FIGS. 2 and 3, an on-chip termination resistor 26 is included along the RF signal termination path between the "anode" of EAM 10 and AC ground plane 20, providing impedance matching to the electronics of driver circuit 14 (and thus minimizing reflections of the RF signal back to driver circuit 14). Termination resistor 26 is preferably formed as part of the conventional chip fabrication process (that is, as a resistive film on the chip surface), but may also comprise a discrete resistor attached or bonded to the chip surface. The high frequency portion of the RF signal passes through on-chip termination resistor and is terminated directly on the chip itself at AC ground plane 20. Therefore, in accordance with the principles of the present invention, the high frequency portion of the RF signal does not pass through any wirebonds to an off-chip capacitor. A gain-peaking wirebond 28 is included along this RF signal termination path to AC ground plane 20, where the length of wirebond 28 is controlled to provide enhanced gain at the Nyquist rate of the data symbols (as mentioned above). In particular, it is preferred that the inductive value of wirebond 28 is selected so that EAM 10 achieves a peak value at the Nyquist frequency of the RF input, which is associated with the optimum performance of the EML of the present invention. In particular, the combined performance of these RF circuit elements and the particular resistive/capacitive/inductive magnitudes that are employed achieve an extended modulation bandwidth when compared with typical prior art EAM termination configurations.

In light of the signal integrity benefits and expanded operating bandwidth provided by the on-chip termination of high frequency components at AC ground plane 20, as well as the distributed capacitor 24 formed by AC ground plane 20 and DC ground plane 2, it is possible to use relatively low-cost, off-chip components to provide proper transmission line termination for the low frequency portion of the RF modulation signal (typically, 1 GHz and less). In preferred embodiments, a de-Q-ing resistor 27 (having a value of only a few ohms) may be included between termination resistor 26 and an electrode of the off-chip capacitor C. De-Q-ing resistor 27 serves to dampen an unwanted RF resonance that may otherwise occur at an intermediate RF frequency.

As mentioned above, an advantage of including on-chip AC ground plane 20 is the ability to use this feature as an access location for introducing the DC reverse bias voltage required for operation of EAM 10 (thus eliminating the need for a bulky bias-T configuration at the input to EAM 10). The configuration as shown in FIG. 2 illustrates the use of AC ground plane 20 to bring the DC reverse-bias voltage (denoted as $V_{eam}$) to the "anode" of EAM 10. While this configuration is considered to be preferred for most applications, it remains possible to use a bias-T network at the input to EAM 10 in the same manner as the prior art to ensure that EAM 10 is properly biased for operation.

Turning now to the particulars of FIG. 3, various aspects of the present invention associated with the integrated structure of EML chip 100 will be described in detail. While the specific configuration shown in FIG. 3 employs a so-called ridge waveguide geometry for the laser and a deep-etched ridge for the modulator, it will be obvious to those skilled in the art that the principles of the present invention are equally applicable to other well-known geometries including, but not limited to, an EML where the laser or modulator are fabricated to exhibit a buried heterostructure geometry. Moreover as mentioned above, the principles of the present invention are equally applicable to systems that are based upon the use of a laser source fabricated within a first chip and an EAM fabricated in a second, separate chip, the two joined by hybrid integration, or employing lens-based optical coupling between them.

With specific reference to FIG. 3, it is also to be understood that EML chip 100 includes a protective, insulating coating 110 (shown in phantom) that protects the active regions of EAM 10 and laser diode 12, and also provides a substantially planarized, flat top surface, here denoted as EML top surface 100S. A dielectric material, such as benzocylcobutane (BCB), may be used as insulating coating 110 to protect and planarize EML chip 100. It is to be understood that the particular layout of components as shown in FIG. 3 is exemplary only, and there are various other topologies and geometries that may be used to provide the on-chip AC ground plane in the manner contemplated by the present invention.

In this particular embodiment, EML chip 100 comprises a substrate 40 of n-type InP, used to support the fabrication of both EAM 10 and laser diode 12. EAM 10 is shown as fabricated to exhibit a mesa structure, including an active layer 42 with a p-type InP waveguiding layer 44 formed over active layer 42. The combination of active layer 42 and p-type InP waveguiding layer 44 is typically etched to create the mesa geometry, forming a ridge waveguide over substrate 40 in the manner shown. In most cases, active layer 42 comprises a stack of quantum wells and barriers, normally made of quaternary crystal alloys of InGaAsP or InGaAlAs that are lattice matched (or nearly lattice matched) to InP (depicted as a multiple quantum well (MQW) active region). At times, n-type InP substrate 40 is referred to as the "cathode" of EAM 10 and p-type InP waveguiding layer 44 is referred to as the "anode" of EAM 10. As mentioned above, InP substrate 40 also functions as DC ground plane 2 of the EML device.

Laser diode 12 is formed on EML chip 100 using a series of conventional fabrication steps, including the formation of a laser gain active region 46 on a portion of substrate 40, with a p-type InP waveguiding layer 48 disposed above it. A bias electrode 50 is disposed over a portion of waveguiding layer 48 and connects bias electrode 50 to DC voltage supply rail 1 (as shown in FIG. 2). As well-understood in the art, this arrangement will create a CW light beam that will propagate along waveguiding layer 44 within an optical mode that is typically vertically centered within active region 42 of the modulator structure.

The RF input signal to EAM 10 is transferred onto EML chip 100 by a first wirebond 17 (from stripline 16 as shown in FIG. 7) to a first bond pad 30 disposed on top surface 100S of EML chip 100. A microstrip 32 is disposed on surface 100S between bond pad 30 and a stripline 34 of EAM 10 and forms the RF input signal path to the "anode" region of EAM 10. The RF signal termination path of EAM 10 is shown in FIG. 3 as including a second bond pad 52 (also formed on top surface 100S), with gain-peaking wirebond 28 is shown as connected between first bond pad 30 and second bond pad 52. In this particular configuration, termination resistor 26 is formed on top surface 100S of EML chip 100 between second bond pad 52 and an AC ground connection pad 54. A via 56 is formed through the thickness of dielectric protective coating 110 underneath AC ground connection pad 54, providing a connection as shown to on-chip AC ground plane 20. It is this connection that provides the on-chip termination of the high-frequency portion of the input RF data signal, improving at least the flatness of the frequency response of EAM 10 of the present invention over prior art off-chip termination arrangements.

Figure 5:
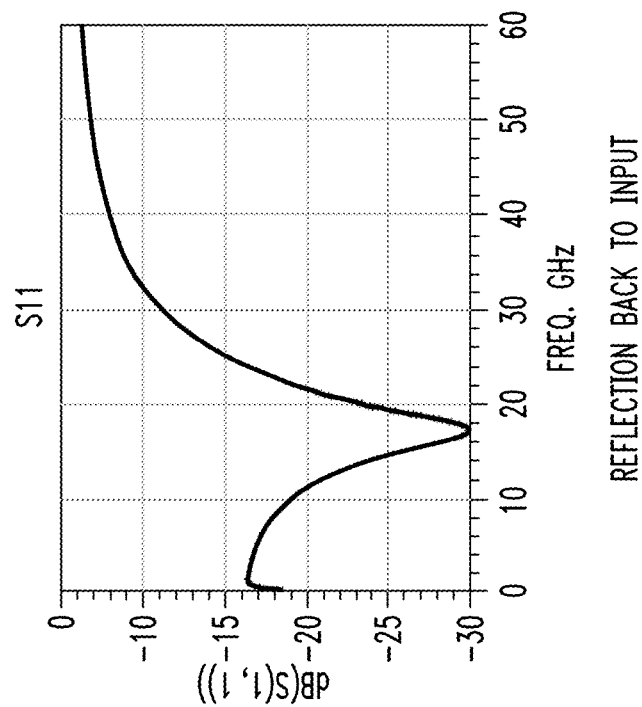
FIG. 5 is a plot of the reflection/return loss (S11) along the input RF drive signal along the incoming transmission line.
Figure 4:
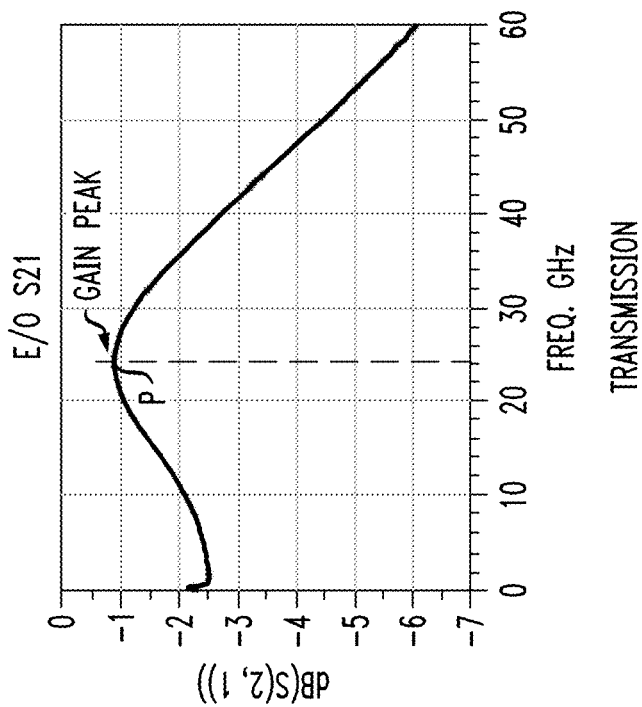
FIG. 4 is a plot of the electrical-to-optical conversion transmission bandwidth (S21) of an EAM formed in accordance with the principles of the present invention.

FIGS. 4 and 5 include graphs of the frequency response for EML chip 100 formed in accordance with the teachings of the present invention. In particular, FIG. 4 plots the electrical-to-optical conversion (S21) transmission bandwidth of EAM 10. The bandwidth of the device is shown as approximately 50 GHz. A peak P is this response is shown in the region of the Nyquist frequency of the applied data signal, the location of peak P controlled by the inductance of wirebond 28 in the manner discussed above. FIG. 5 is graph of reflection/return loss along input data signal transmission path (S11), and illustrates a return loss for frequencies up to about 30 GHz of better than 10 dB. The minimal reflectance is associated with the use of on-chip termination resistor 26 to provide impedance matching to driver circuit 14.

Figure 6:
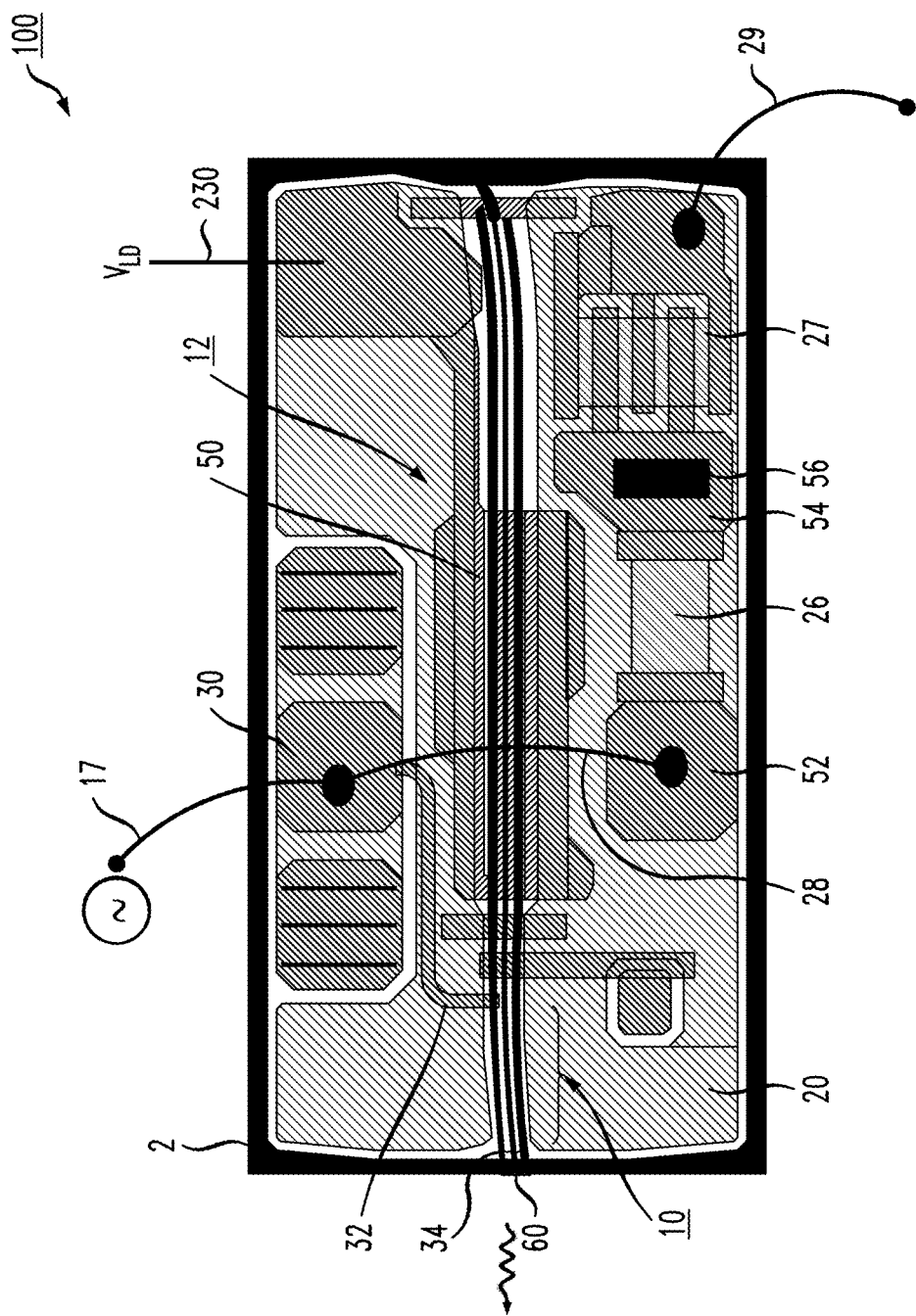
FIG. 6 is a top view of a fully-populated EML chip, illustrating the disposition of both the EAM component and the laser source component.

FIG. 6 is a top view of a fully-populated EML chip 100, again showing the various elements discussed above in association with FIGS. 2 and 3. EAM 10 is shown as terminating along a facet 60 of chip 100, with the modulated light beam continuing to propagate as a free-space beam as it exits waveguiding layer 44 of EAM 10. Particularly illustrated in this view is first bond pad 30 and microstrip 32, used to provide the incoming RF data signal (that is, the modulating signal) to stripline 34 of EAM 10. As discussed above, the termination of the incoming signal is provided by the connection of gain-peaking wirebond 28 between first bond pad 30 and second bond pad 52. Termination resistor 26 is itself shown as positioned between second bond pad 52 and AC ground connection pad 54. De-Q-ing resistor 27 and associated wirebond 29 are disposed as shown, where wirebond 29 terminates at an off-chip capacitor C.

An exemplary "chip-on-carrier" (CoC) configuration incorporating inventive EML chip 100 discussed above is shown in FIG. 7, which is a top view of a carrier 200 used to support EML chip 100. Particularly shown in this illustration is an exemplary signal trace 210 used to bring the data signal from RF drive circuit 14 to microstrip 16. Wirebond 17 is used to connect microstrip 16 to first bond pad 30, forming the RF signal input path in the manner described above. The applied DC bias for laser diode 12 (i.e., DC voltage rail 1) is shown as supplied along a conductive trace 220 on carrier 200, where a wirebond 230 is used to bring this voltage to the laser bias pad 51 on EML chip 100. An exemplary location for "off-chip" capacitor C is also shown in this view. Substrate 40 of EML chip 100 is shown as positioned on (and electrically connected to) a ground contact layer 240 on carrier 200, with off-chip capacitor C clearly shown as far removed from EML chip 100 itself, while still functioning as termination for the low-frequency portion of the RF signal.

The embodiments described above are considered to be illustrative of the principles of the present invention. It is obvious that modifications and variations of arrangements and details described herein will occur to those skilled in the art. Therefore, the invention is intended to be limited solely by the scope of the following claims, and not otherwise limited to the specific details that have been presented using the description and illustration of the embodiments. It should be noted that there are many alternative ways of implementing the ground plane termination of the present invention, and various other material systems within which the EAM and laser source may be formed (indeed, the inventive aspects of the present invention are applicable to configurations where the EAM and light source are presented as separate components). It is therefore intended that the following appended claims be interpreted as including all such alternatives and equivalents, thus forming the scope of the present invention.

What is claimed is:

1. An electro-absorption optical modulator comprising
    a substrate of a first conductivity type, the substrate defined as comprising a top major surface;
    an electro-absorption modulating device formed along a longitudinal extent of the substrate, the electro-absorption modulating device including an active layer and an optical waveguiding layer of a second conductivity type disposed over the active layer, the optical waveguiding layer configured to receive an incoming continuous wave (CW) optical signal and generate an optically modulated output signal therefrom;
    a dielectric layer disposed on a portion of the top major surface of the substrate at a spaced-apart location separate from the electro-absorption modulating device;
    a conductive layer disposed over the dielectric layer, wherein the combination of the substrate, the dielectric layer and the conductive layer form a distributed capacitance within the electro-absorption optical modulator;
    a stripline conductor disposed over an extended portion of the optical waveguiding layer;
    an RF signal input path coupled to the stripline conductor for providing an electrical input RF modulating signal to the electro-absorption modulating device; and
    a resistive RF signal termination path coupled between the stripline conductor and the conductive layer, the conductive layer providing an AC ground termination for the electrical input RF modulating signal of the electro-absorption optical modulator.

2. The electro-absorption optical modulator as defined in claim 1 wherein the modulator further comprises
    a termination resistor disposed along the resistive RF signal termination path, the termination resistor sized to provide impedance matching with a source of the electrical input RF modulating signal.

3. The electro-absorption optical modulator as defined in claim 2 wherein the modulator further comprises
    a wirebond disposed in series with the termination resistor, the wirebond having an inductance selected to provide enhancement of the modulator gain at the Nyquist frequency of the electrical input RF modulating signal.

4. The electro-absorption optical modulator of claim 1 wherein the modulator further comprises
a de-Q-ing resistor coupled between the conductive layer and an off-chip capacitor, minimizing creation of a resonant frequency within the resistive RF signal termination path.

5. The electro-absorption optical modulator of claim 1 wherein a DC voltage source is coupled to the conductive layer, the DC voltage source providing a reverse bias DC voltage for operating the electro-absorption modulating device.

6. The electro-absorption optical modulator of claim 5 wherein the modulator further comprises a bias-T input network coupled to both the DC voltage source and the electrical input modulating signal source, coupling both inputs to the stripline conductor.

7. The electro-absorption optical modulator of claim 1 wherein the substrate comprises n-type InP, the active layer an MQW structure of quaternary materials, and the optical waveguiding layer comprises p-type InP.

8. The electro-absorption optical modulator as defined in claim 7 wherein the MQW comprises a structure formed of either one of InGaAsP and InGaAlAs crystal alloys.

9. An electro-absorption modulated laser comprising
a laser diode source biased to emit a CW optical beam; and
an electro-absorption optical modulator chip including
a substrate of a first conductivity type, the substrate defined as comprising a top major surface;
an electro-absorption modulating device formed along a longitudinal extent of the substrate, the electro-absorption modulating device including an active layer and an optical waveguiding layer of a second conductivity type disposed over the active layer, the optical waveguiding layer configured to receive the continuous wave (CW) optical beam from the laser diode source and generate an optically modulated output signal therefrom;
a dielectric layer disposed on a portion of the top major surface of the substrate at a spaced-apart location separate from the electro-absorption modulating device;
a conductive layer disposed over the dielectric layer, wherein the combination of the substrate, the dielectric layer and the conductive layer form a distributed capacitance within the electro-absorption optical modulator chip;
a stripline conductor disposed over an extended portion of the optical waveguiding layer;
an RF signal input path coupled to the stripline conductor for providing an electrical input RF modulating signal to the electro-absorption modulating device; and
a resistive RF signal termination path coupled between the stripline conductor and the conductive layer, the conductive layer providing an AC ground termination for the electrical input RF modulating signal of the electro-absorption modulated laser.

10. The electro-absorption modulated laser as defined in claim 9 wherein the laser diode source is formed on the substrate in optical alignment with the electro-absorption modulating device.

* * * * *